US008981234B2

(12) United States Patent
Ohmi et al.

(10) Patent No.: US 8,981,234 B2
(45) Date of Patent: Mar. 17, 2015

(54) WIRING BOARD AND METHOD OF MANUFACTURING THE SAME

(75) Inventors: Tadahiro Ohmi, Sendai (JP); Tetsuya Goto, Sendai (JP)

(73) Assignees: National University Corporation Tohoku University, Miyagi (JP); Daisho Denshi Co., Ltd., Tokyo (JP)

( * ) Notice: Subject to any disclaimer, the term of this patent is extended or adjusted under 35 U.S.C. 154(b) by 510 days.

(21) Appl. No.: 13/003,103

(22) PCT Filed: May 29, 2009

(86) PCT No.: PCT/JP2009/059838
§ 371 (c)(1),
(2), (4) Date: Jan. 7, 2011

(87) PCT Pub. No.: WO2010/010753
PCT Pub. Date: Jan. 28, 2010

(65) Prior Publication Data
US 2011/0114375 A1 May 19, 2011

(30) Foreign Application Priority Data

Jul. 22, 2008 (JP) .................. 2008-188159

(51) Int. Cl.
| H05K 1/09 | (2006.01) |
| H05K 1/02 | (2006.01) |
| H05K 3/00 | (2006.01) |
| H05K 3/38 | (2006.01) |
| H05K 3/42 | (2006.01) |
| H05K 3/46 | (2006.01) |

(52) U.S. Cl.
CPC ............. *H05K 3/381* (2013.01); *H05K 3/388* (2013.01); *H05K 3/421* (2013.01); *H05K 3/4644* (2013.01); *H05K 2201/0179* (2013.01); *H05K 2203/095* (2013.01)
USPC .................. 174/256; 174/257; 29/829

(58) Field of Classification Search
USPC ............................... 174/257; 29/829
See application file for complete search history.

(56) References Cited

U.S. PATENT DOCUMENTS

| 4,910,182 | A | 3/1990 | Hums et al. |
| 6,042,929 | A | 3/2000 | Burke et al. |
| 7,294,217 | B2 * | 11/2007 | Beatson et al. ............. 156/73.1 |
| 8,105,937 | B2 * | 1/2012 | Cheng et al. ................ 438/629 |

(Continued)

FOREIGN PATENT DOCUMENTS

| CN | 1272072 A | 1/2000 |
| DE | 10 2007 001 349 A1 | 5/2008 |

(Continued)

OTHER PUBLICATIONS

Office Action in corresponding Japanese Application No. 2010-521634 mailed May 22, 2013 and an English translation of relevant part.

(Continued)

*Primary Examiner* — William H Mayo, III
*Assistant Examiner* — Hiram E Gonzalez
(74) *Attorney, Agent, or Firm* — Morgan, Lewis & Bockius LLP

(57) ABSTRACT

Adhesiveness between a wiring layer and a resin layer is improved by forming a nitrided resin layer by nitriding a surface of a substrate by plasma, and furthermore, thinly forming a copper nitride film prior to forming a copper film.

17 Claims, 14 Drawing Sheets

(56) References Cited

U.S. PATENT DOCUMENTS

| | | | |
|---|---|---|---|
| 2002/0155702 A1* | 10/2002 | Aoki et al. | 438/653 |
| 2005/0191268 A1 | 9/2005 | Henry et al. | |
| 2007/0013078 A1* | 1/2007 | Lee et al. | 257/762 |
| 2008/0227243 A1* | 9/2008 | Yang et al. | 438/159 |

FOREIGN PATENT DOCUMENTS

| | | |
|---|---|---|
| JP | 3259594 | 11/1991 |
| JP | 10133597 | 5/1998 |
| JP | 11-274723 A | 10/1999 |
| JP | 2000216534 | 8/2000 |
| JP | 2000216534 A * | 8/2000 |
| JP | 2003218516 | 7/2003 |
| JP | 2004162098 | 6/2004 |
| JP | 2007039397 | 2/2007 |
| JP | 2008166420 | 7/2008 |

OTHER PUBLICATIONS

Office Action in corresponding Chinese Application No. 2009-80126816.6 mailed Mar. 25, 2013 and an English translation of relevant part.

* cited by examiner

| Structure of Wiring Layer/ Resin Layer Interface | Copper Nitride/ Nitrided Resin | Copper/ Nitrided Resin | Copper Nitride/ Non-Nitrided Resin | Copper/ Non-Nitrided Resin |
|---|---|---|---|---|
| Peel Strength (kN/m) | 0.92 | 0.53 | 0.12 | 0.02 |

FIG. 3

XPS Spectrum (N1s) After Ar/N₂ Plasma Treatment

| | Conductor Resistance Change Ratio (%) | | | | | | | Judgment |
|---|---|---|---|---|---|---|---|---|
| | Initial State | 10cyc | 20cyc | 30cyc | 40cyc | 50cyc | | |
| Sputtering Applied Sample | 0 | 421 | 922 | 3702 | 3402 | 3962 | | NG |
| Electroless Copper Plated Sample | 0 | 0 | 0 | 1 | 1 | 2 | | OK |

FIG. 11

| | RF Bias Plasma Cleaning | |
|---|---|---|
| Gas Species • Gas Flow Rate | Ar 1000sccm | Ar/H2 (H2 10%) Total 1000sccm |
| Pressure | 50 mTorr | |
| Substrate RF Bias Power | 50W | |
| Time | 100 seconds | |

FIG. 13

| RF Bias Cleaning Condition | Conductor Resistance Change Ratio (%) | | | | | | | Judgment |
|---|---|---|---|---|---|---|---|---|
| | Initial State | 10cyc | 20cyc | 30cyc | 40cyc | 50cyc | | |
| Ar | 0 | 1.5 | 1.6 | 1.6 | 2.1 | 0.6 | | OK |
| Ar/H2 | 0 | 0.5 | −0.4 | −0.2 | 0.7 | −0.2 | | OK |
| none | 0 | 35 | 93 | 137 | 248 | 482 | | NG |

FIG. 14

WIRING BOARD AND METHOD OF MANUFACTURING THE SAME

This is a U.S. National Phase Entry of PCT Application No. PCT/JP2009/059838, filed May 29, 2009, with a priority date of Jul. 22, 2008, based upon Japanese Patent Application No. 2008-188159.

TECHNICAL FIELD

This invention relates to a wiring board and a method of manufacturing the same.

BACKGROUND ART

In general, wiring boards are widely used as printed wiring boards that are mounted with electronic components and so on to form electronic devices. With the miniaturization of the electronic devices and so on, the printed wiring boards are also required to have higher accuracy and higher density. Normally, in the wiring board, copper is used as a wiring material and is formed into a predetermined pattern by electrolytic plating. As a method of forming a feeding layer in this copper wiring electrolytic plating formation, electroless copper plating is carried out after using a wet process as a pretreatment. Thereafter, the electrolytic copper plating is carried out using the electroless plating layer as a seed layer (feeding layer). The electroless plating has a problem that, as compared with the electrolytic plating, it is difficult to suppress variation in plating quality, a large amount of a chemical solution is required, and the number of required steps is large. In view of this, a method of forming copper of a seed layer by a sputtering process has been studied as a process that replaces the electroless plating.

However, there has been a problem that the copper formed by the sputtering process is poor in adhesion to an electrically insulating layer of a printed board, i.e. a thermosetting resin, and thus cannot be put to practical use.

In order to solve this problem, it has been proposed to form CuN as an adhesion layer under a copper seed layer which is formed by sputtering (Patent Document 1, Patent Document 2).

PRIOR ART DOCUMENT

Patent Document

Patent Document 1: JP-A-2003-218516
Patent Document 2: JP-A-H10-133597

SUMMARY OF THE INVENTION

Problem to be Solved by the Invention

Although Patent Documents 1 and 2 form, by sputtering, CuN as the adhesion layer under the copper seed layer which is formed by sputtering, the present inventors have found that the adhesion strength is still insufficient and cannot withstand practical use.

Therefore, it is an object of this invention to provide a wiring board in which a sputtered copper seed layer has an excellent adhesion strength, and to provide a method of manufacturing such a wiring board.

Means for Solving the Problem

According to this invention, there is provided a wiring board, comprising a wiring pattern formed on an electrically insulating layer, wherein, in at least a region, where the wiring pattern is adhered, of a surface of the electrically insulating layer, the electrically insulating layer is nitrided and adhered to a nitride of a metal which forms at least part of the wiring pattern.

Further, according to this invention, there is provided a wiring board, comprising a first wiring pattern, an electrically insulating layer formed so as to cover the first wiring pattern, a via hole formed in the electrically insulating layer so as to expose part of the first wiring pattern, a wiring material buried in the via hole, and a second wiring pattern electrically connected to the wiring material buried in the via hole and formed on a surface of the electrically insulating layer, wherein, in at least a region, where the second wiring pattern is adhered, of the surface of the electrically insulating layer, the electrically insulating layer is nitrided and adhered to a nitride of a metal which forms at least part of the second wiring pattern.

Further, according to this invention, there is provided the wiring board wherein the wiring material contains a metal which is the same as the metal forming at least the part of the second wiring pattern and the electrically insulating layer is nitrided and adhered to a nitride of the metal at a side wall of the via hole.

Further, according to this invention, there is provided the wiring board wherein the electrically insulating layer is nitrided by forming a gas containing a nitrogen gas into a plasma to produce and irradiate active nitrogen.

Further, according to this invention, there is provided the wiring board wherein the electrically insulating layer is a carboxyl group-containing thermosetting resin, the electrically insulating layer which is nitrided is a nitrided carboxyl group-containing thermosetting resin, and the nitride of the metal is copper nitride.

Further, according to this invention, there is provided the wiring board wherein the nitride of the metal is copper nitride having a resistivity of 10 μΩcm or less.

Further, according to this invention, there is provided the wiring board wherein the nitride of the metal is copper nitride having a film thickness of 1 nm or more and 100 nm or less and the metal is copper and is adhered to the copper nitride.

Further, according to this invention, there is provided a wiring board manufacturing method, comprising a step of nitriding at least part of a surface of an electrically insulating layer, a step of forming copper nitride on the surface, which is nitrided, of the electrically insulating layer, a step of forming copper to a film thickness of 500 nm or less on the copper nitride by sputtering, and a step of forming, using the copper as a seed layer, copper by electrolytic plating.

Further, according to this invention, there is provided the wiring board manufacturing method wherein the step of nitriding comprises a step of forming a gas containing nitrogen into a plasma to produce active nitrogen and irradiating the active nitrogen to at least the part of the surface of the electrically insulating layer.

Further, according to this invention, there is provided a wiring board manufacturing method, comprising a step of forming a first wiring pattern, a step of forming an electrically insulating layer so as to cover the first wiring pattern, a step of nitriding at least part of a surface of the electrically insulating layer, a step of forming a hole in the electrically insulating layer so as to expose part of the first wiring pattern, an ion irradiation step of irradiating ions, in the form of a plasma, having an irradiation energy of 30 eV or more to a surface portion, which is exposed by the hole, of the first wiring pattern, a step of forming copper nitride on the surface, which is nitrided, of the electrically insulating layer and on the surface portion, which is irradiated with the ions, of the first wiring pattern, a step of forming copper to a film thickness of 500 nm or less on the copper nitride by sputtering, and a step of forming, using the copper as a seed layer, copper by electrolytic plating.

Further, according to this invention, there is provided the wiring board manufacturing method wherein the step of nitriding at least the part of the surface of the electrically insulating layer is carried out after the step of forming the hole in the electrically insulating layer so as to expose the part of the first wiring pattern or after the ion irradiation step.

Further, according to this invention, there is provided the wiring board manufacturing method wherein the plasma used in the ion irradiation step is a plasma which is formed from a gas containing hydrogen and contains active hydrogen.

Further, according to this invention, there is provided the wiring board manufacturing method wherein the step of nitriding and the ion irradiation step are simultaneously carried out using a gas containing nitrogen and hydrogen as a gas which is formed into a plasma.

Further, according to this invention, there is provided the wiring board manufacturing method wherein the step of forming the copper nitride comprises a step of forming the copper nitride by reactive sputtering in a sputtering apparatus, which uses a copper target and introduces a gas containing a nitrogen gas.

Further, according to this invention, there is provided the wiring board manufacturing method wherein the step of forming the copper on the copper nitride by the sputtering comprises a step of forming the copper by the sputtering in the sputtering apparatus by introducing an inert gas subsequently to the reactive sputtering.

Effect of the Invention

According to this invention, it is possible to obtain a wiring board with a sputtered copper seed layer having an excellent adhesion strength.

BRIEF DESCRIPTION OF THE DRAWINGS

FIG. 3 is a diagram showing the results of a peel strength test in the embodiment 1.

FIG. 11 is a diagram showing the hot oil test results of a sample formed using sputtering (sputtering applied sample) and a chain resistance sample as a reference formed using electroless copper plating, in the embodiment 5.

FIG. 13 is a diagram showing the cleaning conditions carried out in the embodiment 5.

FIG. 14 is a diagram showing the hot oil test results in the embodiment 5.

MODE FOR CARRYING OUT THE INVENTION

Hereinbelow, embodiments of this invention will be described with reference to the drawings.

Embodiment 1

Figure 1:
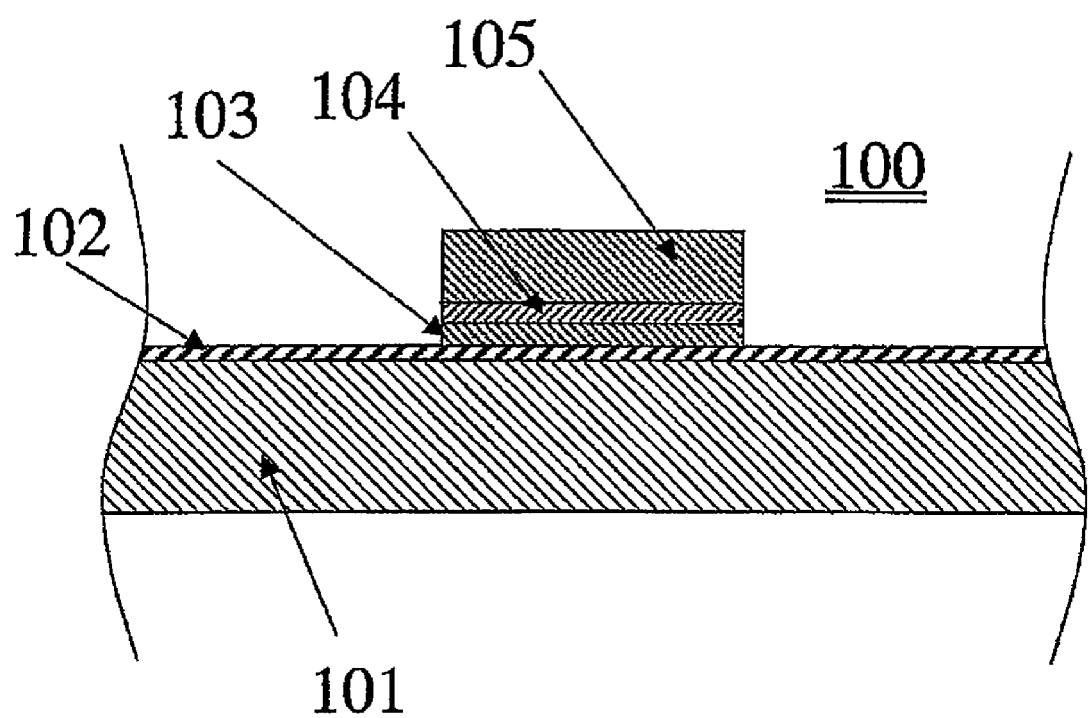
FIG. 1 is a cross-sectional view showing a wiring board 100.

FIG. 1 shows a first embodiment. In a wiring board 100 shown in FIG. 1, 101 denotes a substrate of a carboxyl group-containing thermosetting resin.

The inventors have discovered that, as compared with the case where copper is directly formed on the substrate 101, the adhesion between a wiring layer and a resin layer is improved by nitriding a surface of the substrate 101 by plasma to form a nitrided resin layer and further forming a thin film of copper nitride before forming a film of copper.

Figure 2:
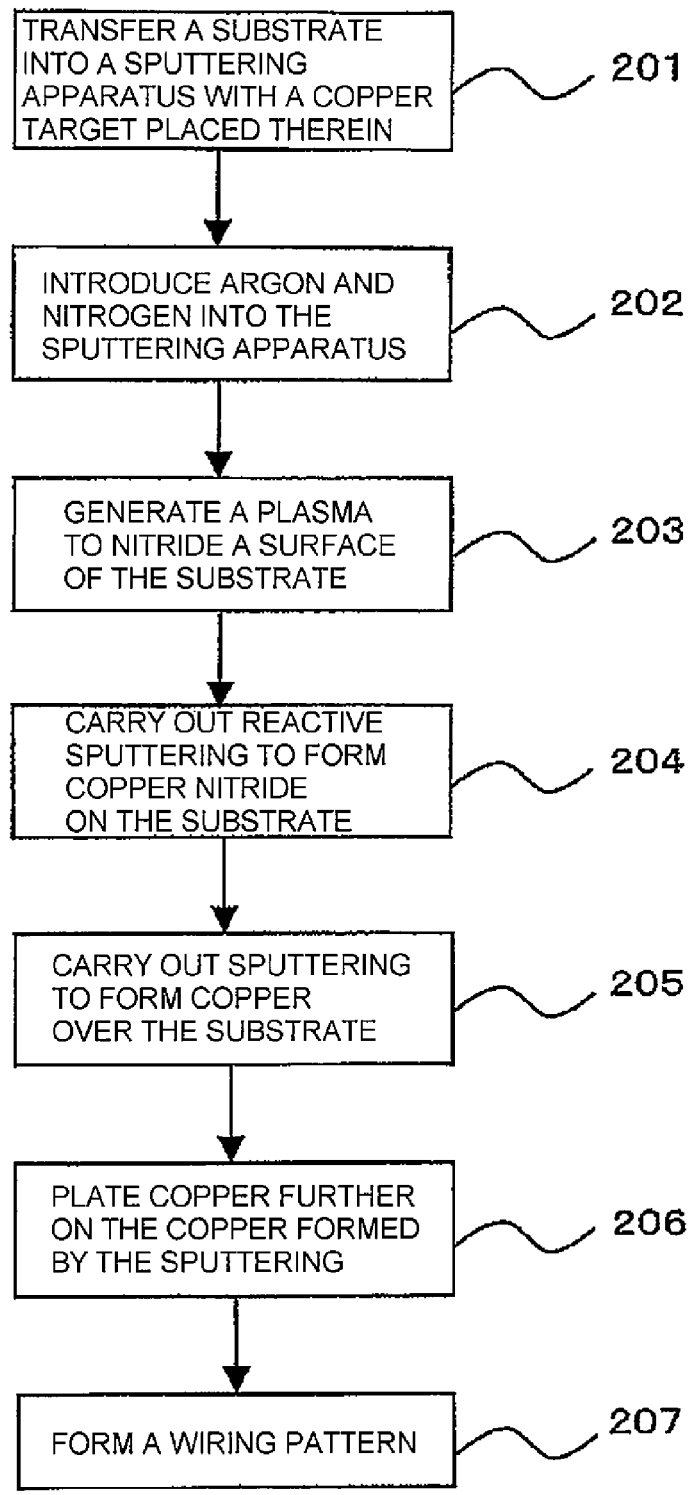
FIG. 2 is a flowchart showing manufacturing steps of the wiring board 100 in an embodiment 1.

Hereinbelow, a specific wiring forming method will be described with reference also to FIG. 2.

First, in order to form copper wiring, the substrate 101 was transferred into a magnetron sputtering apparatus with a copper target placed therein (step 201).

Then, argon and nitrogen were introduced into the apparatus at flow rates of 500 sccm and 200 sccm, respectively, and the pressure was set to 100 mTorr (step 202).

Then, the RF power with a frequency of 13.56 MHz was applied to the copper target at a power density of 0.3 W/cm$^2$ to excite a plasma, thereby exposing the substrate 101 to the plasma for 5 minutes. As a result, electrons generated in the plasma impinged on nitrogen molecules to produce active nitrogen radicals and ions so that a surface of the substrate 101 was nitrided to form a nitrided resin layer 102 (step 203). Hereupon, although the film forming rate was very low because the power density was set low while the pressure was set as high as 100 mTorr, a copper nitride film of 0.8 nm was formed on the substrate 101.

Then, the pressure was reduced to 5 mTorr while maintaining the same flow rates of argon and nitrogen and the DC power was introduced at a power density of 3 W/cm$^2$, thereby carrying out reactive sputtering to form copper nitride 103 to 50 nm (step 204). Then, the introduction of the nitrogen gas was stopped while the pressure was set at 5 mTorr only with the argon gas, thereby forming a film of copper 104 to 100 nm at the power density of 3 W/cm$^2$ (step 205).

Incidentally, it is also effective to empty-sputter the copper target (not sputtered onto the substrate by moving the substrate) between steps 204 and 205.

Then, using the copper 104 as a seed layer, a film of copper 105 was formed to 25 μm by electrolytic plating (step 206).

Thereafter, a wiring pattern shown in FIG. 1 was formed by wet etching (step 207). Copper nitride and copper can be etched by the same chemical solution such as, for example, sulfuric acid/hydrogen peroxide.

Through the above-mentioned steps, the wiring board 100 was completed.

FIG. 3 shows the effect when a nitrided resin layer and copper nitride were introduced. FIG. 3 shows the film structures of the interfaces between a wiring layer and a resin layer and the results of a peel strength test. In the results of FIG. 3, a resin is a carboxyl group-containing thermosetting resin and copper nitride is copper nitride having a film thickness of 50 nm. When conducting the peel strength test, copper nitride was formed to 50 nm and then copper was formed to 100 nm by continuous sputtering film formation in the case of the interface being copper nitride while copper was formed to 100 nm on a resin by sputtering in the case of the interface being copper. Thereafter, copper was formed to 25 μm by electrolytic plating in either of the cases. As is clear from FIG. 3, it is seen that an excellent peel strength of 0.92 kN/m was obtained only in the case of the interface being copper nitride/nitrided resin and that the peel strengths were very low in the other combinations. In the case of the interface being copper/nitrided resin, since 0.8 nm copper nitride was formed upon nitriding a resin as described above, the peel strength was as high as 0.53 kN/m as compared with a non-nitrided resin, which, however, was low as compared with the result in the case of the interface being copper nitride/nitrided resin. That is, in order to improve the adhesion, copper nitride having a certain film thickness is required and it is desirable that copper nitride of preferably 1 nm or more be formed.

Embodiment 2

Figure 4:
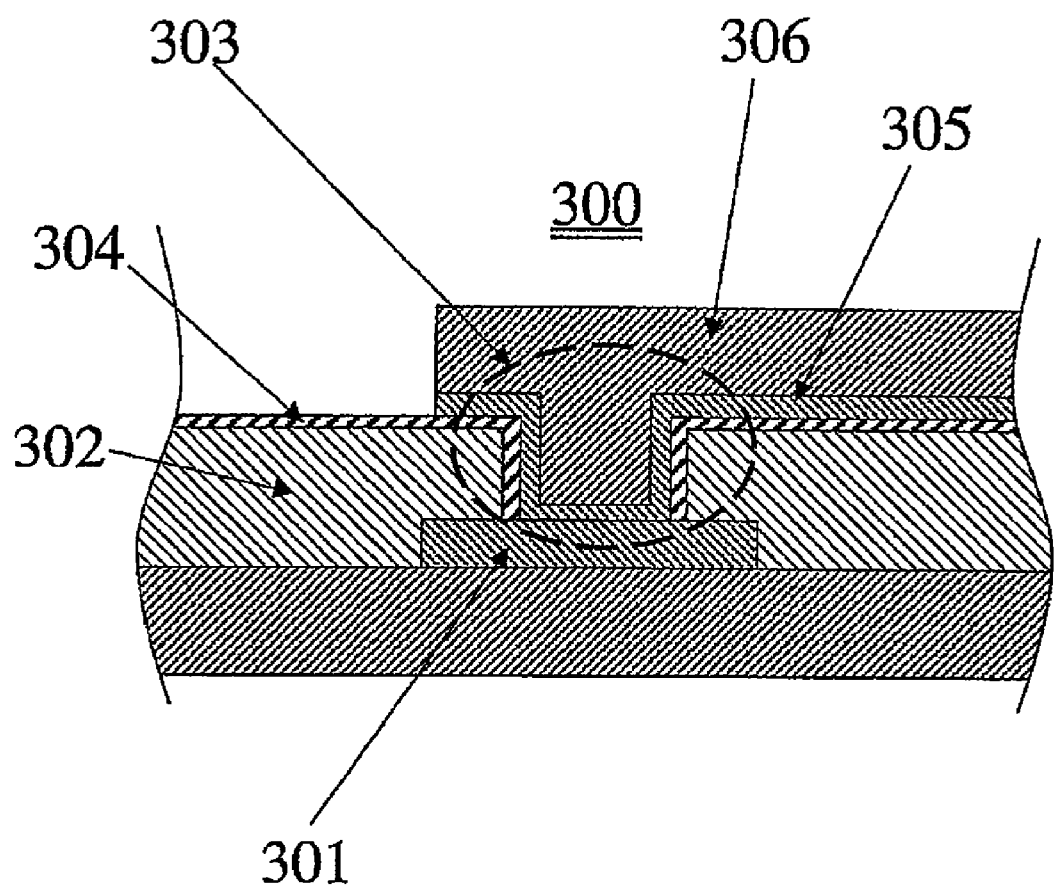
FIG. 4 is a cross-sectional view showing a wiring board 300.

Referring to FIG. 4, a second embodiment of this invention will be described. A description will be omitted of portions which are duplication of the first embodiment.

In a wiring board 300 shown in FIG. 4, 301 denotes a copper wiring pattern, 302 a resin layer made of a carboxyl group-containing thermosetting resin or the like, and 303 a contact-forming via hole, i.e. a hole penetrating the insulating layer in a vertical direction. In order to form a wiring pattern connecting from the copper wiring pattern 301 to a surface of the resin layer 302 through the via hole, a nitrided resin layer 304 was formed by argon/nitrogen plasma, copper nitride 305 was formed to 50 nm by argon/nitrogen reactive sputtering, a copper wiring layer 306 was further formed by sputtering and electrolytic plating, and then the wiring pattern was formed by wet etching. When a current flows from the copper wiring pattern 301 to the copper wiring layer 306, it should pass through the copper nitride 305 at a bottom portion of the via hole. Since the resistance of copper nitride is higher than that of copper, it is not preferable to set the thickness thereof too large. In order not to excessively increase the electrical resistance while ensuring the effect of improving the adhesion, the film thickness of the copper nitride is preferably 100 nm or less.

Embodiment 3

In order to confirm the bonding state of a nitrided resin layer in this invention, a test using XPS (X-ray Photoelectron Spectroscopy) was performed for resin layers and the results were compared.

The test conditions were as follows.

First, a cyclic polyolefin (COP) thermosetting resin was prepared as a resin and a film thereof was formed to 100 nm on each of three Si wafers. Then, the following different treatments were applied thereto, respectively.

Treatment Condition 1: Initial Sample: Sample before Treatment

Treatment Condition 2: Ar/$N_2$ Cleaning Sample

Plasma treatment was applied to an initial sample at a pressure of 100 mTorr with an RF power of 100 W for 10 seconds while introducing argon and nitrogen at flow rates of 500 sccm and 200 sccm, respectively (the same conditions as in steps 202 and 203 in the embodiment).

Treatment Condition 3: Ar Plasma Cleaning Sample

Plasma treatment was applied to an initial sample at a pressure of 100 mTorr with an RF power of 100 W for 10 seconds while introducing argon at a flow rate of 500 sccm (no nitrogen introduced).

C1s, O1s, and N1s XPS spectra were measured for resin layers of these samples. The XPS take-off angle was 5°.

Figure 5:
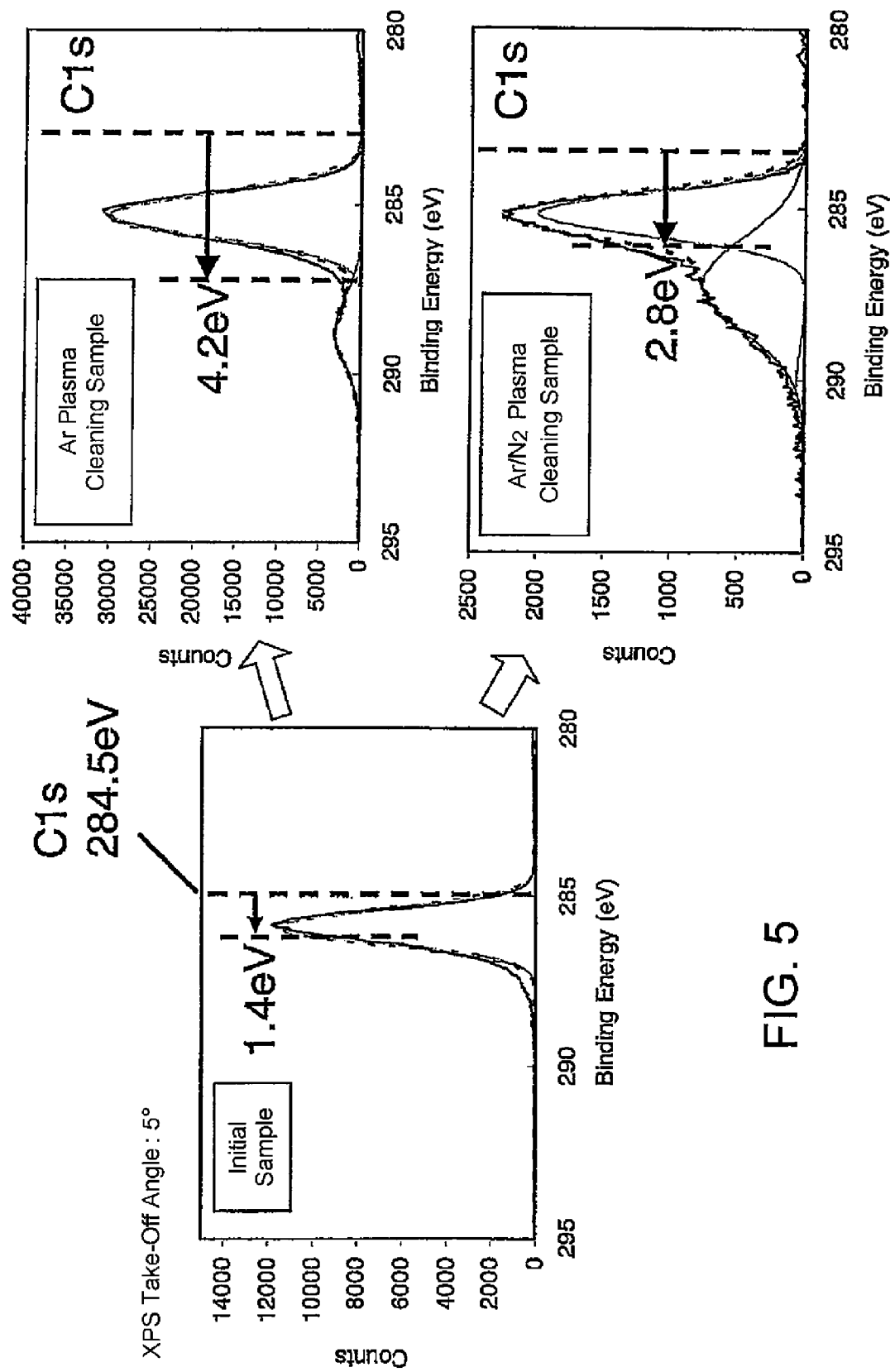
FIG. 5 is a diagram showing the C1s XPS spectra in an embodiment 3.

First, the C1s XPS spectra are shown in FIG. 5.

From FIG. 5, components that shifted to the high energy side by about 2.8 eV were increased in the Ar/$N_2$ plasma cleaning sample.

This is considered to suggest that N—C—O or N—C=O bonds were formed in the resin of the Ar/$N_2$ plasma cleaning sample.

Figure 6:
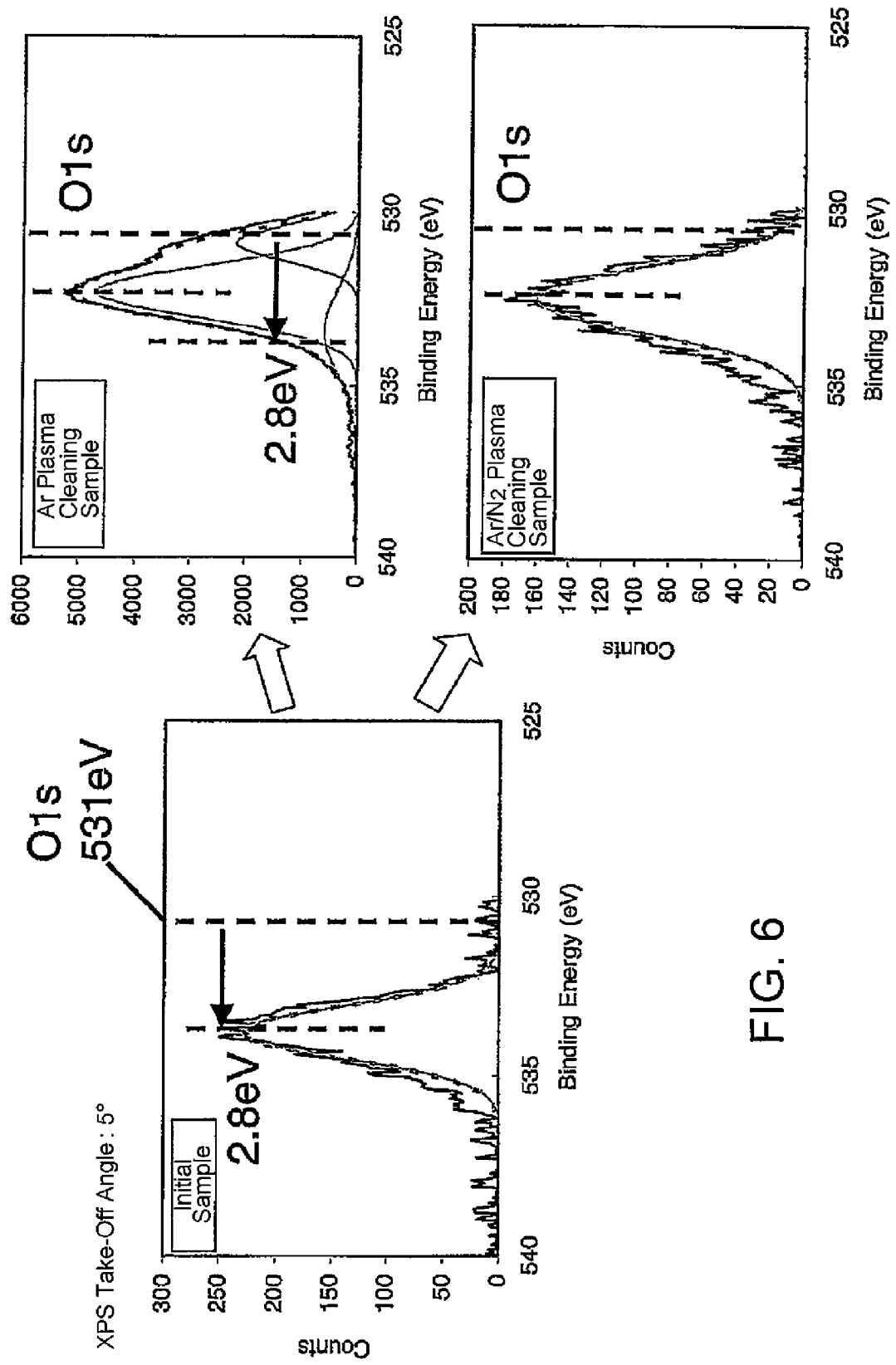
FIG. 6 is a diagram showing the O1s XPS spectra in the embodiment 3.

Next, the O1s XPS spectra are shown in FIG. 6.

From FIG. 6, it is seen that there was no chemical shift, i.e. bonds were not changed, in the Ar/$N_2$ plasma cleaning sample. On the other hand, it is seen that C—O bonds were broken in the Ar plasma cleaning sample. This is considered to show that oxygen portions of a resin crosslinking agent were cut. It is seen that, in order not to cut C—O bonds, the ion irradiation energy should be set to 4.2 eV or less (i.e. the electron temperature should be set to 0.76 eV or less) in the cleaning with Ar plasma. It is preferable to use Xe plasma in terms of reducing the plasma electron temperature.

Figure 7:
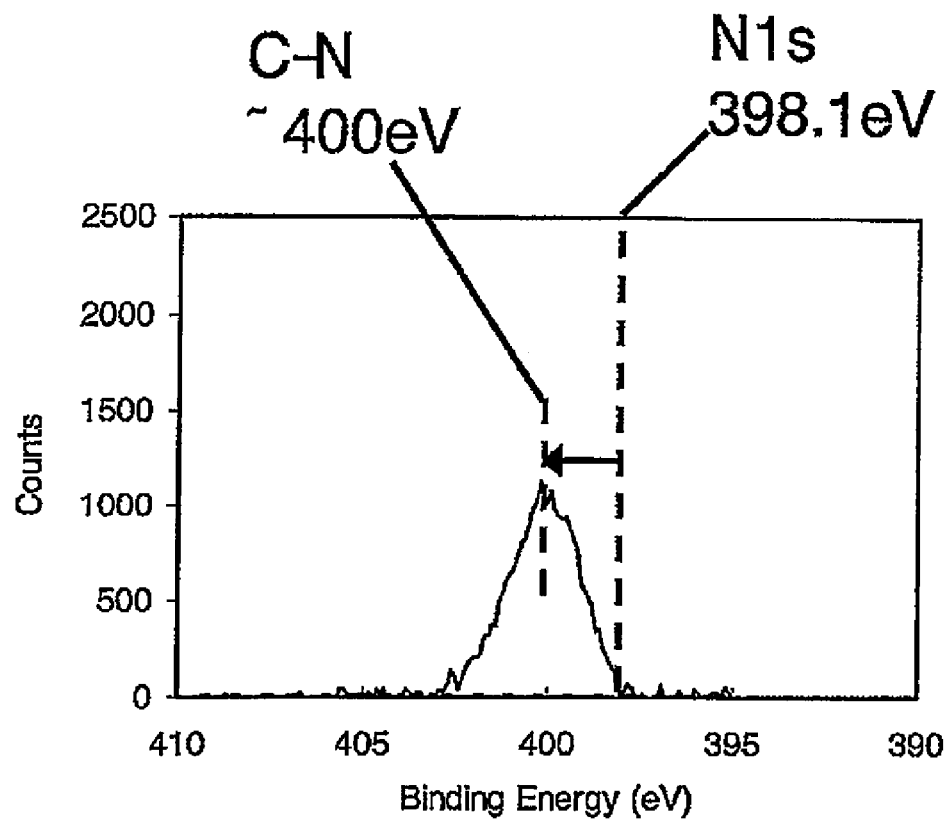
FIG. 7 is a diagram showing the N1s XPS spectrum in the embodiment 3.

Next, the N1s XPS spectrum is shown in FIG. 7.

From FIG. 7, in the Ar/$N_2$ plasma cleaning sample, nitrogen was contained so that a chemical shift presumably due to C—N bonds was observed.

From the above, it is seen that the resin layer of the Ar/$N_2$ plasma cleaning sample was bonded to N, i.e. was a nitride layer.

Accordingly, it is confirmed that the nitridation was stably performed also in the embodiments 1 and 2.

Embodiment 4

In order to confirm the film properties of copper nitride in this invention, the X-ray diffraction (XRD) measurement and the resistivity examination of copper nitride formed by reactive sputtering with argon/nitrogen gas discharge were carried out using a film of copper nitride deposited on a silicon thermal oxide film substrate.

Figure 8:
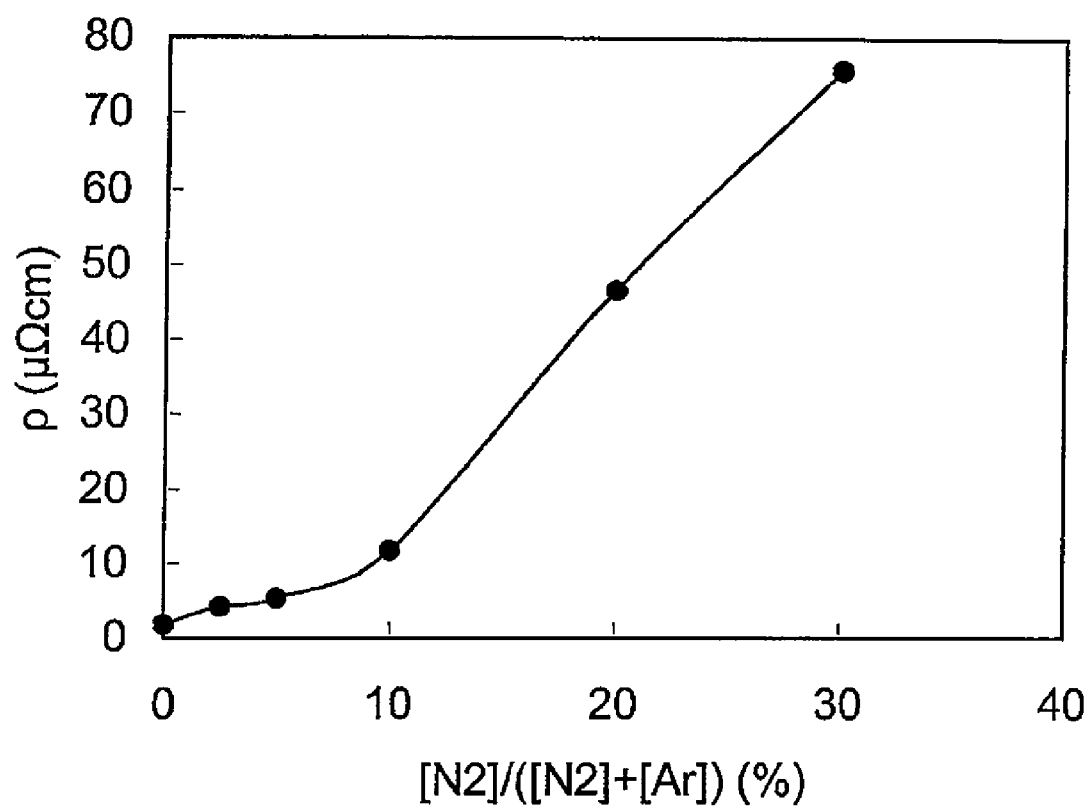
FIG. 8 is a diagram showing the dependence of the resistivity on the nitrogen flow rate ratio in an embodiment 4.

FIG. 8 shows the dependence of the resistivity on the nitrogen flow rate ratio.

The resistivity examination was carried out by setting the pressure to 5 mTorr, the RF power of 13.56 MHz to 2 W/cm$^2$, and the target DC voltage to −300V. The nitrogen flow rate ratio is a ratio of the nitrogen flow rate to the total flow rate of argon and nitrogen. It is seen that the resistivity rapidly increases from around a point where the nitrogen flow rate ratio exceeds 10%.

Figure 9:
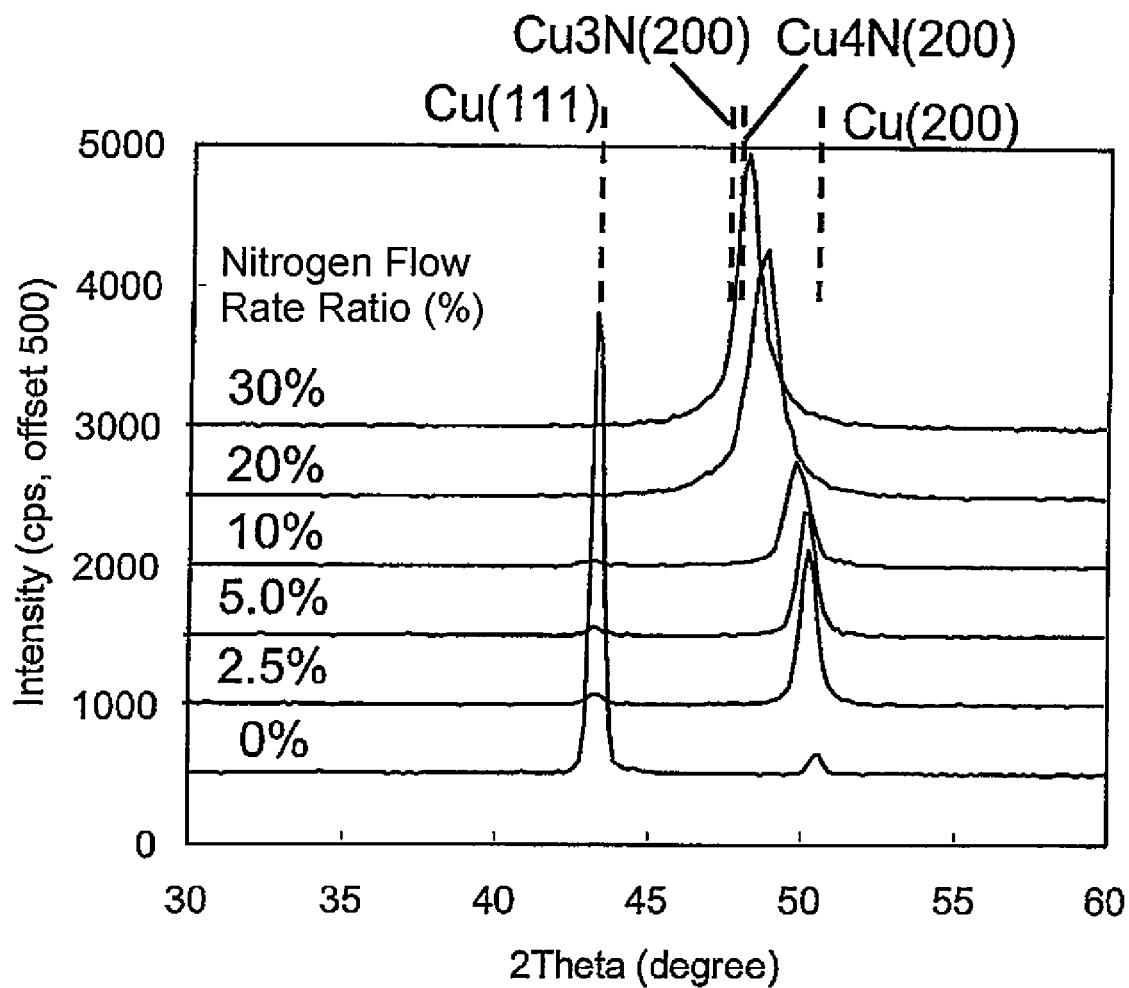
FIG. 9 is a diagram showing the results of examining the XRD measurement results of copper nitrides for respective nitrogen flow rate ratios in the embodiment 4.

Next, FIG. 9 shows the results of examining the XRD measurement results of copper nitrides for respective nitrogen flow rate ratios. When the nitrogen flow rate is zero, a copper thin film of approximately Cu (111) orientation (43.3°) is obtained, while, by introducing only 2.5% nitrogen, the (111) orientation is offset and a peak appears around 50° close to Cu (200). As the nitrogen flow rate ratio increases, a peak approaches a $Cu_4N$ (200) orientation (47.9°). However, as is also seen from FIG. 8, there is a drawback that as the composition approaches $Cu_4N$, the resistivity increases so that when formed into a wiring pattern, the wiring resistance, particularly that of a via-hole contact, increases. In order not to excessively increase the resistance while maintaining the adhesion to a resin, the resistivity of copper nitride is preferably 10 μΩcm or less. That is, under the film forming conditions in this embodiment, the nitrogen flow rate ratio is preferably suppressed to about 8% or less. It has been confirmed by a peel strength test that, even in the case of the copper nitride formed at the nitrogen flow rate ratio of 2.5%, the adhesion to a resin is sufficient.

Embodiment 5

Figure 10:
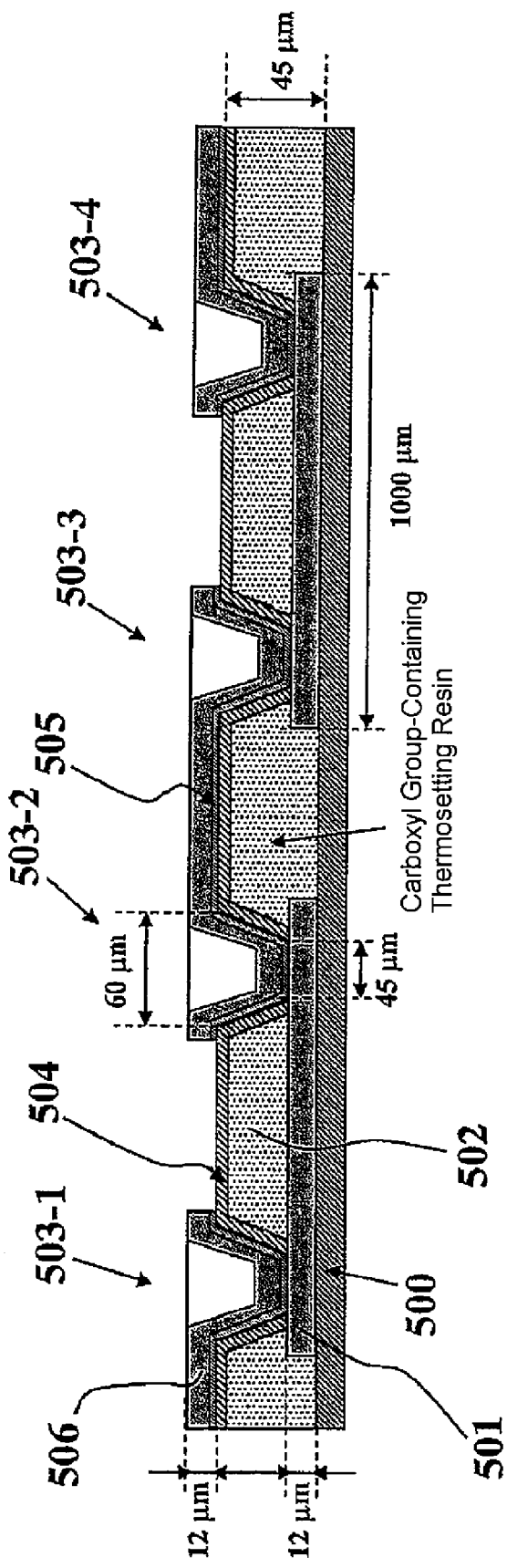
FIG. 10 is a schematic diagram of a printed board formed with a chain resistance pattern in an embodiment 5.

Referring to FIG. 10, a fifth embodiment of this invention will be described.

In this embodiment, the reliability of a wiring pattern was examined by conducting a hot oil test. The hot oil test is such that a printed board formed with a chain resistance is immersed in oil heated to 260° C. and in water of 20° C. for 10 seconds, respectively, and given that this forms one cycle, the conductor resistance is measured upon every repetition of 10 cycles to test whether or not there is an increase in resistance due to disconnection or the like. If a change in conductor resistance value after performing 50 cycles is within ±10%, the test is judged to be passed.

FIG. 10 is a schematic diagram of a printed board formed with a chain resistance pattern.

A number of copper wiring patterns 501 were formed on a resin substrate 500 and an insulating resin layer 502 made of a carboxyl group-containing thermosetting resin was formed on the wiring patterns 501 and on a substrate surface where the wiring patterns 501 were not formed. The insulating resin layer 502 was formed with via holes for contact formation to predetermined portions (both end portions) of the wiring patterns 501, i.e. holes 503-1, 503-2, 503-3, 503-4 penetrating the insulating layer 502 in a vertical direction.

In order to form upper-layer wiring patterns 506 connecting from the copper wiring patterns 501 to a surface of the resin layer 502 through the via holes, a nitrided resin layer 504 was formed by nitriding the surface of the resin layer 502 by argon/nitrogen plasma, copper nitride 505 was provided by argon/nitrogen reactive sputtering, an upper-layer copper wiring layer 506 was further formed by sputtering and electrolytic plating, and then the wiring patterns were formed by wet etching.

In FIG. 10, the size of the wiring board is 140 mm×140 mm, the diameter and the number of the via holes 503-1 to 4, etc. are 50 μm and 10000 (100×100), respectively, the wiring width and length of each lower-layer wiring pattern 501 are 100 μm and 1000 μm (the length between the centers of the via holes at both ends of each wiring pattern is 800 μm), respectively, the conductor thickness of the inner-layer wiring layer 501 is 12 μm, and the conductor thickness of the outer-layer wiring layer 506 is 12 μm.

FIG. 11 shows the hot oil test results of a sample formed using sputtering (sputtering applied sample) and a chain resistance sample as a reference formed using electroless copper plating. The sputtering applied sample was subjected to the resin nitridation and the copper nitride forming process as described above. Initial conductor resistance values were within 140Ω±3Ω in both samples and there was observed no significant increase in resistance due to the introduction of copper nitride in the sputtering applied sample.

However, as shown in FIG. 11, it is seen that while the resistance was not degraded in the electroless copper plated sample in the hot oil test, the resistance was increased in the sputtering applied sample and thus there is a problem in reliability thereof. In order to examine its cause, SEM observation of a via hole cross-section was performed after the hot oil test. As a result, traces considered to be generated by peeling were observed at the interface between Cu of the lower-layer wiring layer 501 and a via bottom portion in the sputtering applied sample. On the other hand, no such traces were observed in the sample applied with the electroless copper plating. That is, it is conjectured that the sputtering applied sample was degraded in reliability due to low adhesion between Cu of the lower-layer wiring layer 501 and the sputtered copper (copper nitride). Accordingly, in order to improve the adhesion to Cu of the lower-layer wiring layer 501, an RF bias was applied to a sample substrate to generate a plasma of Ar ions, thereby carrying out RF bias cleaning with properly increased kinetic energy of the ions irradiated from the plasma.

Figure 12:
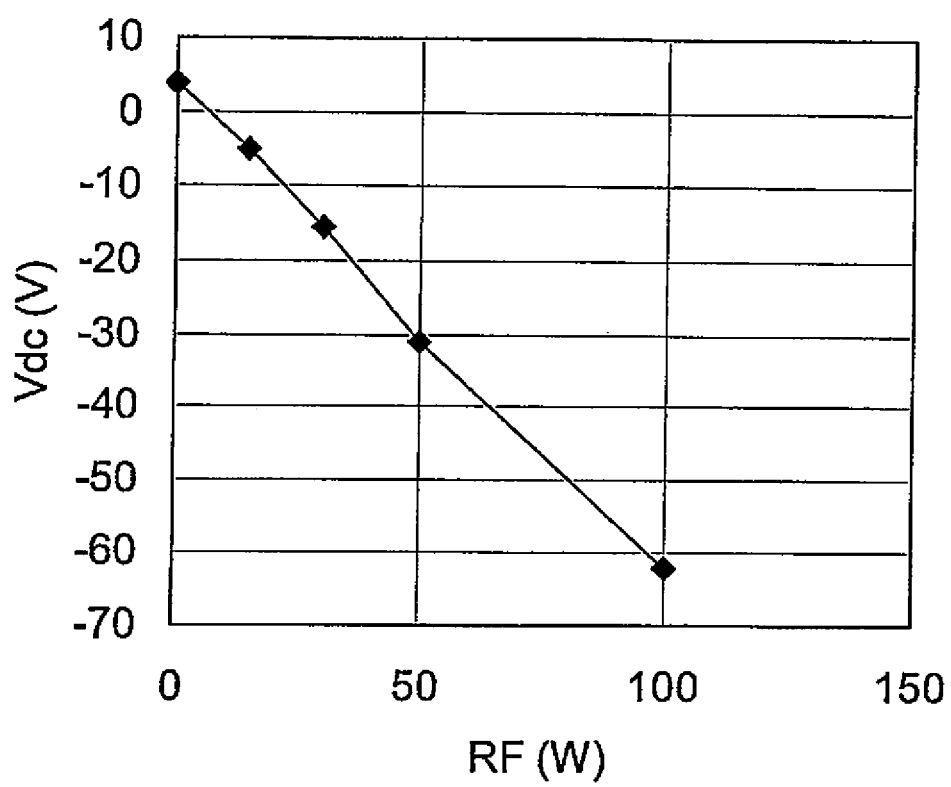
FIG. 12 is a diagram in which the self-bias voltage Vdc (V) applied to a sample substrate is plotted against the substrate RF bias power RF (W) in the embodiment 5.

FIG. 12 is a diagram in which the self-bias voltage Vdc (V) applied to the sample substrate in this event is plotted against the substrate RF bias power RF (W). It is seen that when the RF power is applied, a negative self-bias voltage is generated. Assuming that the self-bias voltage is Vdc and the plasma potential is Vp, the ion irradiation energy irradiated to the substrate is approximately given by e (Vp−Vdc), where e is unit charge. That is, since the plasma potential is about 15V and since, for example, Vdc when the substrate RF bias power is 50 W is about −30V, the ion irradiation energy at this time becomes 45 eV.

Further, in order to efficiently remove an oxide coating film of Cu of the lower-layer wiring layer 501, Ar/H$_2$ plasma for providing a reducing atmosphere was also studied. The cleaning conditions carried out are shown in FIG. 13.

The substrate RF bias power was set to 50 W so as to allow the ion irradiation energy to steadily exceed 30 eV. The hot oil test results are shown in FIG. 14.

Samples shown in FIG. 14 were all subjected to ion irradiation by Ar gas plasma or Ar/H$_2$ gas plasma after formation of via holes (a sample with no irradiation was also prepared as a comparative example), then subjected to surface nitridation of a resin layer and a copper nitride forming process, and finally subjected to sputtering of copper, wherein the adhesion between a resin and a metal layer was sufficiently obtained and the initial conductor resistance values were within 140Ω±3Ω in all the samples.

From the results shown in FIG. 14, it is seen that the samples introducing the RF bias cleaning with increased ion irradiation energy passed the hot oil test and thus are reliable in both cases of Ar plasma and Ar/H$_2$ plasma. On the other hand, it is seen that the sample with no RF bias cleaning carried out is not reliable as expected. It is seen that particularly the sample subjected to the RF bias cleaning with the Ar/H$_2$ plasma is highly reliable because active hydrogen generated in the Ar/H$_2$ plasma efficiently removed the oxide coating film of Cu of the lower-layer wiring layer 501 so that the conductor resistance change ratio was within ±1% in any of the cycles of the hot oil test. It has also become clear that, even by using the Ar/H$_2$ plasma, it is not possible to pass the hot oil test without carrying out the cleaning with the application of the substrate RF bias.

While the reliable wiring board and its manufacturing method have been shown above, the gas pressure, the gas flow rate ratio, the time, and so on in the plasma cleaning conditions are not limited to this embodiment. Further, although the ion irradiation process using the Ar gas or Ar/H$_2$ gas plasma was carried out before the resin layer surface nitridation and the copper nitride forming process, it may be carried out after the surface nitridation and before the copper nitride forming process. Alternatively, plasma irradiation may be carried out using, instead of the Ar/H$_2$ gas plasma, a gas in which a N$_2$ gas is added to an Ar/H$_2$ gas, a mixed gas in which an ammonia gas is added to an Ar gas, or a mixed gas of a gas containing hydrogen, a gas containing nitrogen, and an inert gas, thereby simultaneously carrying out the above-mentioned ion irradiation process and resin layer surface nitridation process.

INDUSTRIAL APPLICABILITY

While the description has been given using the above-mentioned embodiments, it is needless to say that the same effect can be obtained even by providing a plasma processing chamber for resin nitridation separately from a sputtering chamber and, further, the resin and the metal are not limited to the embodiments.

Further, in the above-mentioned embodiments, the wiring pattern was formed by wet etching after forming the copper film by electrolytic plating. However, the wiring pattern forming method is not limited to the embodiments such that a lift-off layer may be formed in advance before sputtering film formation, thereby forming a wiring pattern by a lift-off method after copper electrolytic plating. In any case, a wiring pattern should be formed by a technique that can ensure the adhesion between a nitrided resin surface and copper nitride.

The invention claimed is:

1. A wiring board, comprising:
a nitrided insulating layer that is entirely formed on an electrically insulating layer,
a copper nitride that is partially formed on the nitrided insulating layer, and
a copper film formed on the copper nitride, wherein the copper nitride and the copper film constitute a wiring pattern, and
a lamination of the copper nitride and the nitrided insulating layer is provided between the electrically insulating layer and the copper film,
wherein the copper nitride alone has a resistivity of 10 µΩcm or less,
wherein a first peel strength of the lamination of the copper nitride and the nitrided insulating layer is higher than a sum of a second peel strength and a third peel strength, the second peel strength corresponding to a lamination of the copper film and the nitrided insulating layer while the third peel strength corresponding to a lamination of the copper nitride and a non-nitrided insulating layer, wherein the first peel strength is 0.92 kN/m, the second peel strength is 0.53 kN/m and the third peel strength is 0.12 kN/m.

2. A wiring board, comprising:
a first wiring pattern,
an electrically insulating layer formed so as to cover the first wiring pattern,
a via hole formed in the electrically insulating layer so as to expose part of the first wiring pattern,
a copper nitride that is buried in the via hole and is partially formed over the electrically insulating layer,
a second wiring pattern electrically connected to the copper nitride buried in the via hole, and a nitrided insulating layer that is entirely formed on a surface of the electrically insulating layer,
wherein a lamination of the copper nitride and the nitrided insulating layer is provided between the electrically insulating layer and the second wiring pattern,
wherein the copper nitride alone has a resistivity of 10 µΩcm or less,
wherein a first peel strength of the lamination of the copper nitride and the nitrided insulating layer is higher than a sum of a second peel strength and a third peel strength, the second peel strength corresponding to a lamination of the copper film and the nitrided insulating layer while the third peel strength corresponding to a lamination of the copper nitride and a non-nitrided insulating layer, wherein the first peel strength is 0.92 kN/m, the second peel strength is 0.53 kN/m and the third peel strength is 0.12 kN/m.

3. The wiring board according to claim 2, wherein the wiring material contains a metal which is the same as the metal forming at least the part of the second wiring pattern and the electrically insulating layer is nitrided and adhered to a nitride of the metal at a side wall of the via hole.

4. The wiring board according to claim 1 or 2, wherein the electrically insulating layer is nitrided by forming a gas containing a nitrogen gas into a plasma to produce and irradiate active nitrogen.

5. The wiring board according to claim 1 or 2, wherein the electrically insulating layer is a carboxyl group-containing thermosetting resin, the electrically insulating layer which is nitrided is a nitrided carboxyl group-containing thermosetting resin, and the nitride of the metal is copper nitride.

6. The wiring board according to claim 1 or 2, wherein the nitride of the metal is copper nitride having a resistivity of 10 µΩcm or less.

7. The wiring board according to claim 1 or 2, wherein the nitride of the metal is copper nitride having a film thickness of 1 nm or more and 100 nm or less and the metal is copper and is adhered to the copper nitride.

8. A wiring board manufacturing method, comprising:
a step of nitriding at least part of a surface of an electrically insulating layer to form a nitrided insulating layer on the electrically insulating layer,
a step of forming copper nitride on the nitrided insulating layer,
a step of forming copper to a film thickness of 500 nm or less on the copper nitride by sputtering, and
a step of forming, using the copper as a seed layer, copper by electrolytic plating,
wherein the copper nitride alone has a resistivity of 10 µΩcm or less,
wherein a first peel strength of the lamination of the copper nitride and the nitrided insulating layer is higher than a sum of a second peel strength and a third peel strength, the second peel strength corresponding to a lamination of the copper film and the nitrided insulating layer while the third peel strength corresponding to a lamination of the copper nitride and a non-nitrided insulating layer, wherein the first peel strength is 0.92 kN/m, the second peel strength is 0.53 kN/m and the third peel strength is 0.12 kN/m.

9. A wiring board manufacturing method, comprising:
a step of forming a first wiring pattern, a step of forming an electrically insulating layer so as to cover the first wiring pattern,
a step of nitriding at least part of a surface of the electrically insulating layer to form a nitrided insulating layer on the surface of the electrically insulating layer,
a step of forming a hole in the electrically insulating layer so as to expose part of the first wiring pattern,
an ion irradiation step of irradiating ions, in the form of a plasma, having an irradiation energy of 30 eV or more to a surface portion, which is exposed by the hole, of the first wiring pattern,
a step of forming copper nitride on a surface of the nitrided insulating layer and on the surface portion, which is irradiated with the ions, of the first wiring pattern,
a step of forming copper to a film thickness of 500 nm or less on the copper nitride by sputtering, and
a step of forming, using the copper as a seed layer, copper by electrolytic plating, wherein the copper nitride alone has a resistivity of 10 μΩcm or less, wherein a first peel strength of the lamination of the copper nitride and the nitrided insulating layer is higher than a sum of a second peel strength and a third peel strength, the second peel strength corresponding to a lamination of the copper film and the nitrided insulating layer while the third peel strength corresponding to a lamination of the copper nitride and a non-nitrided insulating layer, wherein the first peel strength is 0.92 kN/m, the second peel strength is 0.53 kN/m and the third peel strength is 0.12 kN/m.

10. The wiring board manufacturing method according to claim 9, wherein the step of nitriding at least the part of the surface of the electrically insulating layer is carried out after the step of forming the hole in the electrically insulating layer so as to expose the part of the first wiring pattern or after the ion irradiation step.

11. The wiring board manufacturing method according to claim 9, wherein the plasma used in the ion irradiation step is a plasma which is formed from a gas containing hydrogen and contains active hydrogen.

12. The wiring board manufacturing method according to claim 8 or 9, wherein the step of nitriding comprises a step of forming a gas containing nitrogen into a plasma to produce active nitrogen and irradiating the active nitrogen to at least the part of the surface of the electrically insulating layer.

13. The wiring board manufacturing method according to claim 8 or 9, wherein the step of nitriding and the ion irradiation step are simultaneously carried out using a gas containing nitrogen and hydrogen as a gas which is formed into a plasma.

14. The wiring board manufacturing method according to any one of claim 8 or 9, wherein the step of forming the copper nitride comprises a step of forming the copper nitride by reactive sputtering in a sputtering apparatus, which uses a copper target and introduces a gas containing a nitrogen gas.

15. The wiring board manufacturing method according to claim 14, wherein the step of forming the copper on the copper nitride by the sputtering comprises a step of forming the copper by the sputtering in the sputtering apparatus by introducing an inert gas subsequently to the reactive sputtering.

16. An electronic device, comprising:
the wiring board according to claim 1 or 2.

17. An electronic device manufacturing method, comprising: the steps according to claim 8 or 9.

* * * * *